United States Patent [19]

Jackson et al.

[11] 3,908,075

[45] Sept. 23, 1975

[54] LEAD FRAME SUPPORT FOR SEMICONDUCTOR DEVICES

[75] Inventors: Sydney Jackson, Hayfield; Alan Arthur Shepherd, Bramhall, both of England

[73] Assignee: Ferranti Limited, Hollinwood, England

[22] Filed: Nov. 17, 1972

[21] Appl. No.: 307,374

[30] Foreign Application Priority Data

Nov. 20, 1971 United Kingdom .............. 53985/71

[52] U.S. Cl. ................ 174/68.5; 29/626; 29/193.5; 29/182.5; 174/52 PE; 317/101 CP; 317/101 F; 357/70

[51] Int. Cl.² .......................................... H05K 1/18

[58] Field of Search .......... 174/DIG. 3, 525, 52 PE, 174/68.5; 317/101 CC, 101 CP, 101 A, 101 F; 29/626, 193, 193.5, 182.5, 195; 357/70

[56] References Cited

UNITED STATES PATENTS 3,316,458 4/1967 Jenny .......................... 317/101 CP 3,440,027 4/1969 Hugle ......................... 174/52 PE X

FOREIGN PATENTS OR APPLICATIONS 2,021,484 7/1970 France ......................... 317/101 CC 1,209,901 10/1970 United Kingdom ........... 174/DIG. 3

OTHER PUBLICATIONS

Donaher et al., "Single Chip Carrier Package", IBM Technical Disclosure Bulletin, Vol. 12, No. 4, September 1969, p. 538.

*Primary Examiner*—Darrell L. Clay

*Attorney, Agent, or Firm*—Cameron, Kerkam, Sutton, Stowell & Stowell

[57] ABSTRACT

A support for a semiconductor device comprises a lead frame having a matrix of cranked conductors, which may be on an insulating substrate, with a recess being defined within the lead frame, the arrangement being such that by merely placing a correctly orientated device in the recess, and providing the required electrical interconnections between the device and the conductors, the device is accurately located in its required position on the lead frame.

6 Claims, 7 Drawing Figures

LEAD FRAME SUPPORT FOR SEMICONDUCTOR DEVICES

Figure 1:
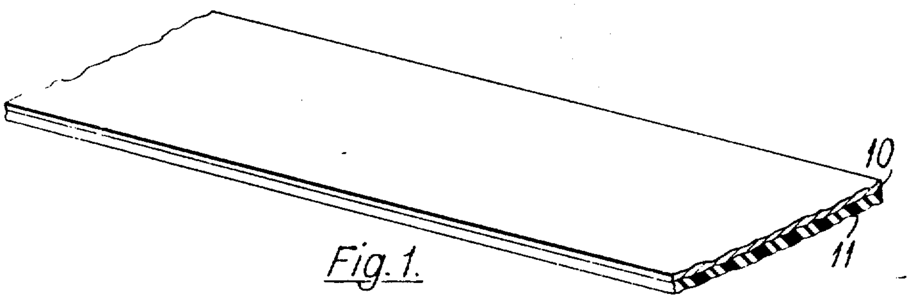

This invention relates to supports for semiconductor devices each support including a matrix of conductors initially in the form of a lead frame.

The lead frame may comprise the support for a semiconductor device, or may comprise a carrier lead frame which is bonded, for example, to a larger, main lead frame, or to a conventional header arrangement, to complete the support for the semiconductor device. The semiconductor device on its support is then encapsulated by being moulded within a plastics material or by being enclosed in an hermetically-sealed, evacuated enclosure. At least a part of the conductor matrix of the lead frame is encapsulated with the semiconductor device, the conductor matrix being wholly encapsulated if it initially comprises part of merely a carrier lead frame of the support for the semiconductor device.

End portions of the conductors of the lead frame are arranged to be such that a semiconductor device, when correctly orientated, is capable of being mounted satisfactorily on the lead frame with each device contact being connected exclusively to a co-operating conductor.

Previously it has been known to use precision optical aligning means to ensure that the semiconductor device is sufficiently accurately located on the end portions of the conductors of the lead frame in order to arrange that each device contact may be connected, exclusively, to a co-operating conductor.

It is an object of the present invention to provide a novel construction for a lead frame enabling the accurate mounting of a semiconductor device in its desired position on the lead frame to be facilitated by simplifying the action required when placing the device on the lead frame, the action required of the operator being less precise than has been known before for this purpose.

It is another object of the present invention to provide a novel construction for a lead frame which facilitates the mounting of a semiconductor device on the lead frame, by causing at least the device-bearing end portions for the conductors of the lead frame to be supported by an insulating substrate whilst the semiconductor device is being bonded to these end portions.

According to the present invention a lead frame for a support for a semiconductor device comprises a matrix of cranked conductors, thereby to define a recess within the lead frame, the arrangement being such that, with an associated semiconductor device correctly orientated, the device is a sufficiently close fit in the recess to ensure that each contact of the device exclusively is contiguous with a co-operating end portion of a conductor in the recess of the lead frame.

According to another aspect the present invention comprises a method of manufacturing a lead frame comprises providing a plane metal sheet, forming a matrix of conductors within said metal sheet, and deforming each conductor into a cranked form, thereby defining a recess within the lead frame, the arrangement being such that, with an associated semiconductor device correctly orientated, the device is a sufficiently close fit in the recess to ensure that each contact of the device exclusively is contiguous with a co-operating end portion of a conductor in the recess of the lead frame.

According to yet another aspect the present invention comprises a method of mounting a semiconductor device on a lead frame comprising a matrix of cranked conductors, thereby to define a recess within the lead frame, includes inserting the semi-conductor device, when correctly orientated, into the recess within the lead frame, and forming the desired electrical interconnections between the device contacts and co-operating conductor end portions in the recess.

Figure 2:
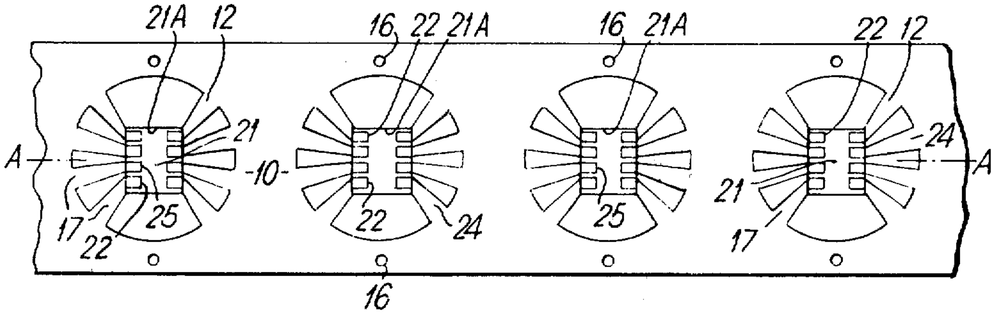
Figure 3:
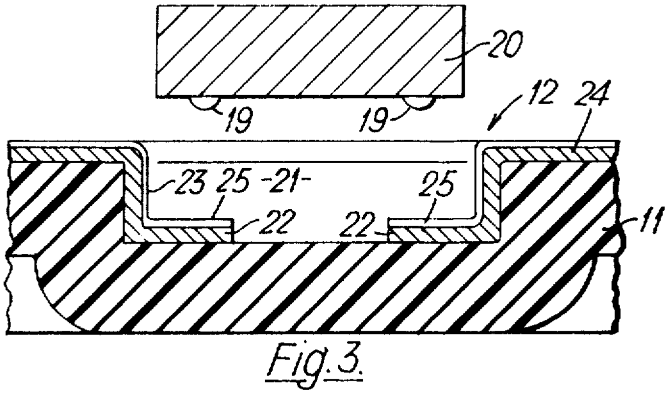
Figure 4:
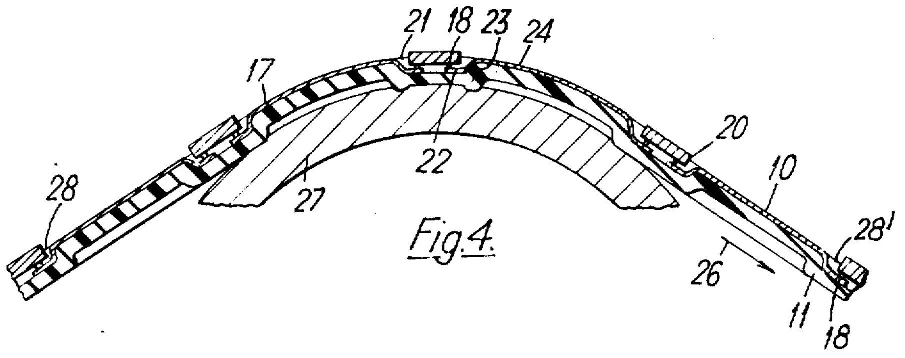
Figure 5:
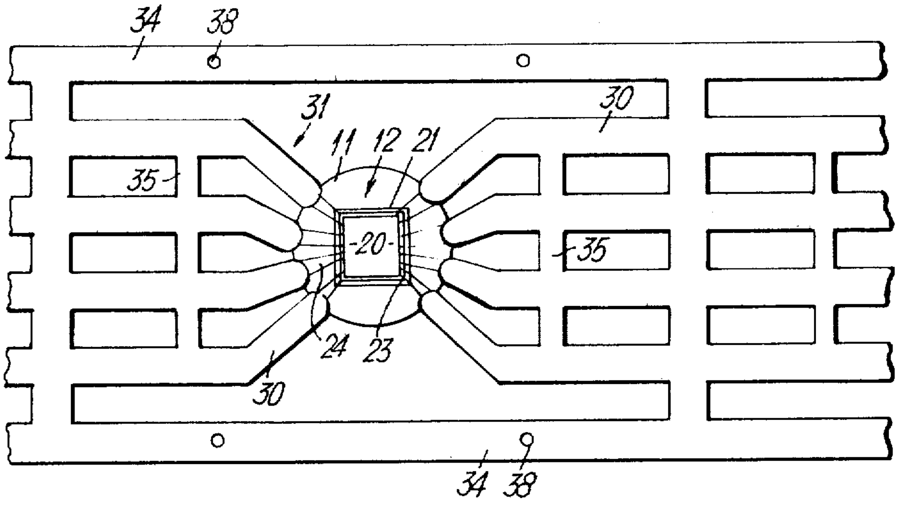
Figure 6:
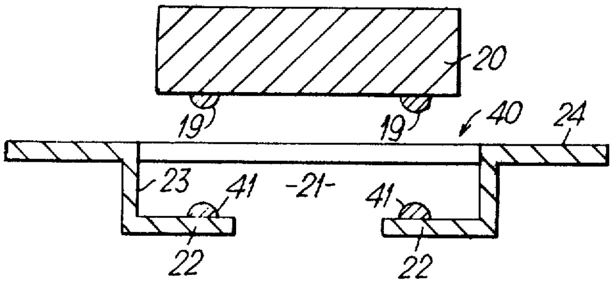
Figure 7:
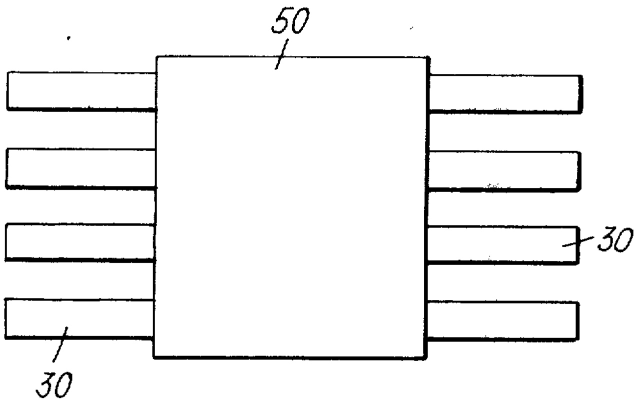

The present invention will now be described by way of example with reference to the accompanying drawings, in which FIG. 1 is a perspective view of one embodiment according to the present invention and shows part of a composite body, from which body is formed a strip comprising a plurality of carrier lead frames supported on an insulating substrate, each carrier lead frame being provided for a support for a semiconductor device, FIG. 2 is a plan view of part of the carrier lead frame strip, FIG. 3 is a section through part of a carrier lead frame of the strip, and also shows a semiconductor device ready to be mounted on the carrier lead frame, FIG. 4 is a section along the longitudinal axis of the strip whilst it is being stressed to displace an intermediate portion of each conductor of each carrier lead frame away from the semiconductor device associated with the carrier lead frame, FIG. 5 is a plan view of the carrier lead frame, carrying a semiconductor device, and secured to a larger, main lead frame to complete the support for the semiconductor device, FIG. 6 corresponds to FIG. 3 but includes a section of another embodiment of a lead frame according to the present invention, the lead frame not being provided on an insulating substrate, and FIG. 7 shows a completed package for the semiconductor device, the package being in the form of a so-called "flat pack", in which package the semiconductor device and carrier lead frame are encapsulated in an epoxy resin.

FIG. 1 shows part of a composite body comprising a plane metal sheet 10 on a flexible insulating substrate 11. From the metal sheet 10 is formed, as shown in FIG. 2, a strip comprising a plurality of identical carrier lead frames 12. The carrier lead frames are for use in supports for semiconductor devices, and are uniformly distributed along, and are uniformly orientated with respect to, the longitudinal axis of the strip. The longitudinal axis of the strip is indicated by the broken line A—A. The carrier lead frames 12 are supported on the flexible insulating substrate 11 in the manner indicated in FIG. 3. The insulating substrate 11 is of a polyimide, and the metal sheet 10 is of silver. The thickness of the silver layer 10 is the desired thickness of the carrier lead frames 12, and the polyimide layer 11 is sufficiently thick to provide the requisite support for the carrier lead frames. The silver layer 10 is evaporatively deposited on the polyimide layer 11.

Initially, as shown in FIG. 2, sprocket holes 16 are punched adjacent to the longitudinal edges of the composite body 10, 11. The sprocket holes 16, which extend through both the silver layer 10 and the polyimide layer 11, ensure that the body is accurately positioned at different stages in automatic processing apparatus employed in the subsequent manufacture of the carrier lead frame strip from the composite body, and possibly also in automatic apparatus for mounting semiconductor devices on the carrier lead frames.

The carrier lead frames 12 are produced in a precise manner by selectively removing parts of the silver layer 10 in a known method employing photolithographic etching techniques. Each carrier lead frame 12 comprises a matrix of conductors 17 arranged to be connected by electrical interconnections, indicated at 18 in FIG. 4, to contacts 19 of an associated, square-shaped, semiconductor device 20, as shown in FIG. 3.

Each semiconductor device 20 when satisfactorily mounted on a carrier lead frame 12 of the strip has a contact connected to a conductor 17 of the carrier lead frame. Thus, the pattern of co-operating conductor end portions 22 of each carrier lead frame 12 corresponds to the pattern of contacts on each device.

The parts of the silver layer 10 extending between the carrier lead frames 12 are not removed and, hence, each carrier lead frame is part of an integral structure formed within the silver layer 10.

Recesses 21, square-shaped in profile, are then formed by pressing the square-shaped end of a tool (not shown) into the silver layer 10 at the centre of each carrier lead frame. The boundaries of the recesses 21 are indicated at 21A in FIG. 2. The tool is heated to a temperature of 300°C, and deforms both the silver layer 10 and the polyimide layer 11 to the shape shown in FIG. 3. In each carrier lead frame 12 the constituent conductors 17 extend substantially radially from the centre of the recess 21 onto the undeformed plane surface of the polyimide substrate 11. Within the recess, adjacent end portions 22 of the conductors 17 are spaced both from each other and from the centre of the recess. From the end portions 22, the conductors 17 extend substantially parallel to the longitudinal axis A—A of the strip, and have intermediate portions 23, shown in FIG. 3, which extend on the side walls of the recess 21, and outer end portions 24 which are on the undeformed plane surface of the polyimide substrate 11. Thus, each conductor 17 is cranked into the recess and is wholly supported on the polyimide substrate 11.

The carrier lead frames 12 are completed by electrolytically depositing a layer 25 of tin on their exposed surfaces.

The co-operating contacts 19 on the devices 20 comprise hemispherical protrusions of solder on a passivated surface of the device. Each semiconductor device is formed in a known manner, and the protrusions 19 on the device are formed on selected parts of aluminium conductors (not shown) on the passivated surface of the device 20. The selected aluminium parts are rendered solderable by depositing chemically a first, temporary, layer of zinc from a solution of zinc oxide and caustic soda, removing the first zinc layer with nitric acid solution, and depositing a second, permanent zinc layer on the now clean surface of the aluminium. The second zinc layer has an activated surface and a nickel layer is formed on this surface by the action of a reducing agent on an acid solution of nickel chloride with sodium hypophosphite or sodium borohydride. The surface of the passivating layer on the semiconductor device surrounding the solder protrusions 19 is rendered not-wettable by solder, so that the molten solder does not spread over this surface.

The semiconductor devices 20 are mounted on the carrier lead frames 12 of the strip, to provide so-called flip-chip structures. The square-shaped devices 20 are inserted in the square-shaped recesses 21, and may be inserted manually or by automatic apparatus. The automatic means (not shown) includes a suction head for holding the devices, and indexing mechanism for raising and lowering the head, to deposit the devices in the recesses 21, and for moving the head between a position over a recess and a position where it is capable of picking up a device. In any event, the devices 20 may be placed in the recesses without employing precision optical aligning means, and at a faster rate than the locating of a semiconductor device over co-operating end conductor portions of a lead frame to a sufficient degree of accuracy by precision optical aligning means. The devices are required to be correctly orientated within the recesses, but sufficiently accurate registration between the solder protrusions 19 on the devices and the co-operating end portions 22 of the carrier lead frames is ensured by arranging that the devices are a close fit within the recesses. The difference between the length of each side of the square-shaped recess and the length of each side of the square-shaped device is at most equal to the radius of the hemispherical solder protrusions 19. Thus, each solder protrusion 19 inevitably is exclusively contiguous with a co-operating conductor end portion 22 when the semiconductor device is inserted in the associated recess. The strip is then passed through an oven in which the solder is melted. When resolidified, the solder forms the desired electrical interconnections 18 between the semiconductor device 20 and the carrier lead frame 12. Whilst molten, surface tension forces cause the solder to have the least possible surface area and, thus, the semiconductor device is pulled in the plane of the semiconductor device into exact registration with the co-operating conductor end portions 22 of the carrier lead frame, if the initial placing of the semiconductor device in the recess had not achieved this.

Hence, the degree of accuracy with which the semiconductor devices 20 are mounted in their required positions on the carrier lead frames 12 is automatically dependent on the degree of accuracy of the positions of the solder protrusions 19 formed on the semiconductor devices. The solder protrusions 19 may easily be formed with precision by the known method referred to above, and so the semiconductor devices may be accurately mounted on the carrier lead frames merely by being inserted in their associated recesses.

The end portions 22 of the conductors 17 are supported by the insulating substrate 11 throughout the bonding of the semiconductor devices to these end portions.

The solder protrusions 19 melt at the temperature of 183°C, and the performances of silicon semiconductor devices are not adversely affected by subjecting the semiconductor devices to this temperature.

The provision of the strip having a plurality of carrier lead frames 12 enables a corresponding plurality of semiconductor devices 20 to be mounted simultaneously on the strip in a batch process. Each carrier lead frame of the strip is identical, and the semiconductor devices are also identical, so that a plurality of semiconductor devices may be placed simultaneously in the recesses 21 by multihead automatic apparatus before the strip is passed through the oven.

The positions of the solder protrusions 19 on the devices 20 are arranged to be such that the side walls of the mounted semiconductor devices 20 are inevitably spaced from the side walls of the recesses 21. Hence, short circuits should not occur between the semiconductor devices and the intermediate portions 23 of the conductors on the side walls of the recesses. However, in order to ensure complete reliability in this respect, the strip is stretched temporarily to displace permanently these intermediate portions 23 of the cranked conductors away from the semiconductor devices 20. The presence of the rigid bodies of the semiconductor devices 20 cause the centres of the recesses 21 of the strip beneath the devices not to be affected by any such stretching action, if the region of the strip around each device is stretched substantially individually. The electrical interconnections 18 between each semiconductor device 20 and the associated conductor end portions 22 provide sufficiently strong anchorages to ensure that the conductor end portions 22 are not displaced by a significant amount. However, the amount of displacement of the flexible insulating substrate 11 increases progressively away from these anchorages due to the stretching action, and this displacement causes the cranked conductor 17 to tend to straighten. The intermediate portions 23 of the conductors extending on the side walls of the recesses 21 do not return to their initial positions when the stretching action is removed. In the illustrated arrangement, with all the conductors 17 extending substantially parallel to the longitudinal axis A—A of the strip, the strip is stretched only along this axis. As shown in FIG. 4, the strip is passed, in the direction indicated by the arrow 26, over a part-cylindrical curved surface 27, so that each carrier lead frame 12 is caused to be bowed substantially individually to produce the desired stretching action. The initial gap 28 between the side walls of the recess 21 and the side walls of the semiconductor device is increased, as shown at 28', after the strip has passed over the part-cylindrical curved surface 27.

Subsequently, each carrier lead frame 12, with the associated semiconductor device 20, is severed from the strip. The part of the polyimide substrate 11 beneath the carrier lead frame is removed with the carrier lead frame. The exposed surfaces of the remaining outer portions 24 of each conductor 17 are then soldered to co-operating conductors 30 of a larger, main lead frame 31, as shown in FIG. 5, to complete the support for the device 20. The main lead frame 31 is made of nickel plated with silver, and is stamped from a composite sheet in a multi-stage process. Each carrier lead frame 12 is secured to the co-operating main lead frame 31 by employing a conventional reflow soldering process. The soldering action occurs at regions of the lead frames 12 and 31 remove from the semiconductor device and, thus, these regions of the lead frames may be subjected to the solder melting temperature without adversely affecting the performance of the semiconductor device.

A plurality of main lead frames 31 also are initially in the form of a strip, and a plurality of semiconductor device-carrier lead frame combinations may be mounted simultaneously on the strip. Each main lead frame 31 has a boundary part 34, and tie bars 35 extending between the conductors 30. The boundary part 34 of each main lead frame 31 of the strip is provided with sprocket holes 38 to ensure that the strip is correctly positioned at different stages in the automatic processing apparatus.

Another embodiment of a carrier lead frame 40 according to the present invention is shown in FIG. 6, which Figure corresponds to FIG. 3. Parts of the carrier lead frame 40 of FIG. 6 identical to or closely resembling the carrier lead frame 12 are given the same reference numerals as the parts of FIG. 3. The carrier lead frame 40 is provided in an initially plane metal sheet which is not on an insulating substrate. Thus, the device-bearing conductor end portions 22 are not supported, and the recess 21 is defined solely by the cranked conductors 17. Further, instead of a layer of tin being deposited on the silver carrier lead frame, solder protrusions 41 are provided on the end portions 22. Such a carrier lead frame 40 may be a part of a strip comprising a plurality of carrier lead frames, and the conductors 17 of each carrier lead frame 40 of the strip may be partially straightened in the same manner as that described above in relation to FIG. 4. The solder protrusions 41 are of the same size as the solder protrusions 19 on the semi-conductor device 20. The protrusions 41 on the conductors may be located with accuracy, ensuring that the protrusions 19 on each device are contiguous with the protrusions on the conductors when the device is inserted in the recess 21. Thus, when the solder is melted, to form the desired electrical interconnections between the device contacts and the conductors, the co-operating pairs of protrusions coalesce with each other, and surface tension forces ensures that the device contacts are in exact registration with the cranked end portions of the conductors.

The carrier lead frame 40 also may be mounted on a main lead frame 31.

The package for the semiconductor device 20 is completed by encapsulating the semiconductor device and the carrier lead frame 12 or 40 in an epoxy resin 50 moulded in situ around the combination, as shown in FIG. 7. The conductors 30 of the main lead frame 31 are then rendered electrically discrete by removing the boundary part 34 of the main lead frame 31 and breaking the tie-bars 35 extending between the conductors 30 of the main lead frame. The completed package has the so-called "flat pack" construction.

Suction means for positioning the combinations on the main lead frames 31, moulding apparatus for the epoxy resin 50, and severing means to render the conductors 30 of the main lead frames electrically discrete, all may be embodied in apparatus to enable these process steps to be completed automatically.

Each semiconductor device 20 may be mounted only on a single lead frame, which single lead frame, is fabricated in the manner described above for the carrier lead frame 12 or 40 and solely comprises a support for the device. However, the extension of the outer end portions 24 of the conductors 17 of the carrier lead frame 12 or 40 beyond the periphery of the semiconductor device 20 ensures that it is easier to mount the combination of the carrier lead frame and the semiconductor device on the main lead frame 31 than to mount the semiconductor device on a single lead frame solely comprising the support for device, and having dimensions corresponding to those of the main lead frame. This is because the inner end portions of the conductors 30 of the main lead frame 31 are spaced further apart than would be the case for a single lead frame. Thus, the locating of the carrier lead frame-semiconductor device combination over these inner end portions of the conductors 30 of the main lead frame 31 is caiser than for the semiconductor device 20 alone over the inner end portions of the conductors of a single lead frame.

The carrier lead frame strip may be wound around a reel after the semiconductor devices 20 have been mounted on the strip. When an insulating substrate 11 wholly supports the conductors of the carrier lead frames it is not necessary to provide a separate insulating sheet between the turns of the strip when wound upon the reel. The semiconductor devices may reside wholly within the recesses 21 formed in the strip.

The semiconductor devices 20 may be tested after they are mounted on the carrier lead frame strip, and also after they are mounted on the main lead frame strip. Semiconductor devices which are found to be faulty, or to be improperly mounted, at either of these stages may be removed.

When the conductors 17 are on an insulating substrate 11 the conductors 17 of each carrier lead frame 12 of the strip initially may be formed electrically isolated from each other when the silver layer 10 is etched. In addition a hole may be formed through the insulating substrate 11 at each position where a semiconductor device 20 is to be mounted. Thus, the contact-bearing face of the semiconductor device may be washed by a liquid supplied through the hole after the semiconductor device has been mounted on the strip.

The lead frames 12 of 40 and 31 may be of any convenient material, for example, the carrier lead frame 12 or 40 may be of copper instead of silver. The insulating substrate 11 also may be of a polyester or of a polyamide instead of a polyimide.

The final encapsulation of the semiconductor device 20 may be in any suitable moulding compound, or may be within an evacuated enclosure, the parts of which enclosure are sealed hermetically to the conductors 17 or 30 of either the carrier lead frame 12 or 40 or the main lead frame 31.

Instead of a dual-in-line package as described above the package may have conductors extending from each side of a square or rectangular shaped semiconductor device. With such an arrangement the semiconductor device-carrier lead frame combination may be stretched over a part spherical surface in order to displace the intermediate portion of each cranked conductor away from the side walls of the semiconductor device.

In either such arrangement, the ends of the conductors beyond the encapsulation for the semiconductor device may be bent so that they may be received in a co-operating socket.

The carrier lead frame-semiconductor device combination may be mounted on a conventional header arrangement, instead of a main lead frame, in order to complete the support for the device.

It it is unnecessary to stretch the carrier lead frame 12 of FIG. 3 in order to displace the intermediate portions 23 of the conductors 17 away from the semiconductor device 20 it is not required that the insulating substrate 11 be flexible. Further, the information of the recesses 21 in the strip may not cause any deformation of the exposed surface of the insulating substrate 11 remote from the silver layer 10.

Where a plurality of semiconductor devices are to be mounted on an integral structure comprising a plurality of lead frames, for example, a plurality of identical semiconductor devices to be interconnected to comprise a matrix of an information storage device, the requisite number of lead frames may be formed from a single composite body comprising a metal sheet on an insulating substrate. The common support for the devices, thus, comprises the lead frames distributed on the sheet to form the desired matrix. The conductors of the matrix may be at least partially completed by arranging that, when the conductors of the lead frames are formed, they are interconnected with each other in the required manner. The insulating substrate is not severed and an additional, more rigid, substrate may not be provided.

What we claim is:

1. A support for semiconductor devices, comprising a flexible insulative strip including a plurality of rectangular recesses each having a supporting base and side walls and being distributed along the longitudinal axis of the strip, each recess including a lead frame for supporting a semiconductor device, each said lead frame comprising at least one matrix of conductors cranked at one end to provide end portions extending in a first plane, constituent conductors extending in a second plane and intermediate portions joining said constituent conductors to corresponding end portions, said end portions and intermediate portions extending into said rectangular recess, said end portions being wholly supported on said base, said first and said second planes being substantially parallel and said intermediate portions extending between said planes and at a right angle to said end portions and constituent conductors and contiguous to adjacent side walls of the recess, adjacent end portions of the conductors within the recess being spaced from each other and from the center of the recess to receive thereon and support within said recess a semiconductor device, the recess being such that with the associated semiconductor device being correctly oriented, a close fit in the recess is provided to ensure that each contact of the device exclusively is contiguous with a cooperating end portion of a conductor of the lead frame extending in the recess.

2. A lead frame as set forth in claim 1 wherein the constituent conductors extend in a radial direction away from the center of the recess.

3. A lead frame as set forth in claim 1 wherein said constituent conductors extend in a radial direction away from the center of the recess.

4. A lead frame as set forth in claim 1 wherein said strip includes sprocket holes adjacent at least one longitudinal edge of the strip.

5. A lead frame as set forth in claim 1 wherein said strip is polyimide.

6. A lead frame as set forth in claim 1 wherein said strip is of a material which is readily deformable at 300°C.

* * * * *